United States Patent
Rooney et al.

(10) Patent No.: US 11,604,694 B2
(45) Date of Patent: *Mar. 14, 2023

(54) ERROR CORRECTION IN ROW HAMMER MITIGATION AND TARGET ROW REFRESH

(71) Applicant: Micron Technology, Inc., Boise, ID (US)

(72) Inventors: Randall J. Rooney, Boise, ID (US); Matthew A. Prather, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/693,990

(22) Filed: Mar. 14, 2022

(65) Prior Publication Data
US 2022/0197740 A1  Jun. 23, 2022

Related U.S. Application Data

(63) Continuation of application No. 17/080,238, filed on Oct. 26, 2020, now Pat. No. 11,294,762, which is a
(Continued)

(51) Int. Cl.
*G11C 29/00* (2006.01)
*G06F 11/10* (2006.01)
(Continued)

(52) U.S. Cl.
CPC ........ *G06F 11/106* (2013.01); *G06F 11/1004* (2013.01); *G11C 11/406* (2013.01);
(Continued)

(58) Field of Classification Search
CPC .......... G11C 2029/0411; G11C 11/406; G11C 29/42; G11C 29/44; G06F 11/106; G06F 11/1004
See application file for complete search history.

(56) References Cited

U.S. PATENT DOCUMENTS 6,147,921 A   11/2000  Novak et al.
6,310,814 B1  10/2001  Hampel et al.
(Continued)

FOREIGN PATENT DOCUMENTS

KR   20180003713 A   1/2018
WO    2006130276 A1  12/2006

OTHER PUBLICATIONS

International Application No. PCT/US2019/044857—International Search Report and Written Opinion, dated Nov. 21, 2019, 11 pages.
(Continued)

*Primary Examiner* — Samir W Rizk
(74) *Attorney, Agent, or Firm* — Perkins Coie LLP

(57) ABSTRACT

Methods, systems, and apparatuses for memory (e.g., DRAM) having an error check and scrub (ECS) procedure in conjunction with refresh operations are described. While a refresh operation reads the code words of a memory row, ECS procedures may be performed on some of the sensed code words. When the write portion of the refresh begins, a code word discovered to have errors may be corrected before it is written back to the memory row. The ECS procedure can be incremental across refresh operations, beginning, for example, each ECS at the code word where the pervious ECS for that row left off. The ECS procedure can include an out-of-order (OOO) procedure where ECS is performed more often for certain identified code words.

20 Claims, 6 Drawing Sheets

Related U.S. Application Data continuation of application No. 16/237,147, filed on Dec. 31, 2018, now Pat. No. 10,817,371.

(51) Int. Cl.
*G11C 29/44* (2006.01)
*G11C 11/406* (2006.01)
*G11C 29/42* (2006.01)
*G11C 29/04* (2006.01)

(52) U.S. Cl.
CPC .............. *G11C 29/42* (2013.01); *G11C 29/44* (2013.01); *G11C 2029/0411* (2013.01)

(56) References Cited

U.S. PATENT DOCUMENTS

| | | | |
|---|---|---|---|
| 8,941,935 | B1 | 1/2015 | Aho et al. |
| 9,384,821 | B2 | 7/2016 | Bains et al. |
| 9,761,298 | B2 | 9/2017 | Halbert et al. |
| 9,812,185 | B2 | 11/2017 | Fisch et al. |
| 10,049,755 | B2 | 8/2018 | Lee et al. |
| 10,156,998 | B1 | 12/2018 | Colgrove et al. |
| 10,817,371 | B2 * | 10/2020 | Rooney .................. G11C 29/44 |
| 11,087,819 | B2 | 8/2021 | Cowles et al. |
| 11,294,762 | B2 * | 4/2022 | Rooney .................. G11C 29/44 |
| 2008/0183916 | A1 | 7/2008 | Bellows et al. |
| 2008/0232184 | A1 | 9/2008 | Ohsawa |
| 2010/0157650 | A1 | 6/2010 | Hashimoto et al. |
| 2011/0255357 | A1 | 10/2011 | Pelley et al. |
| 2012/0155201 | A1 | 6/2012 | Schreck et al. |
| 2013/0304982 | A1 | 11/2013 | Jung et al. |
| 2014/0006703 | A1 | 1/2014 | Bains et al. |
| 2014/0059287 | A1 | 2/2014 | Bains et al. |
| 2014/0095780 | A1 | 4/2014 | Bains et al. |
| 2014/0122788 | A1 | 5/2014 | Swaminathan |
| 2014/0156923 | A1 | 6/2014 | Bains et al. |
| 2014/0173239 | A1 | 6/2014 | Schushan |
| 2014/0192605 | A1 | 7/2014 | Crawford et al. |
| 2015/0109871 | A1 | 4/2015 | Bains et al. |
| 2015/0206558 | A1 | 7/2015 | Ni et al. |
| 2015/0279441 | A1 | 10/2015 | Greenberg et al. |
| 2015/0339188 | A1 | 11/2015 | Hu et al. |
| 2016/0118132 | A1 | 4/2016 | Prins et al. |
| 2017/0110178 | A1 | 4/2017 | Bains |
| 2017/0186481 | A1 | 6/2017 | Oh et al. |
| 2018/0004415 | A1 | 1/2018 | Lee et al. |
| 2018/0061483 | A1 | 3/2018 | Morgan |
| 2020/0043545 | A1 | 2/2020 | Gans |
| 2020/0111525 | A1 | 4/2020 | Cowles et al. |
| 2020/0133517 | A1 | 4/2020 | Shah et al. |
| 2020/0201698 | A1 | 6/2020 | Gans |
| 2020/0210278 | A1 | 7/2020 | Rooney et al. |
| 2021/0042185 | A1 | 2/2021 | Rooney et al. |
| 2021/0065831 | A1 | 3/2021 | Galbraith et al. |
| 2021/0280236 | A1 | 9/2021 | Gans |
| 2021/0358539 | A1 | 11/2021 | Cowles et al. |

OTHER PUBLICATIONS

International Application No. PCT/US2019/055447—International Search Report and Written Opinion, dated Jan. 31, 2020, 10 pages.
International Application No. PCT/US2019/065220—International Search Report and Written Opinion, dated Apr. 9, 2020, 10 pages.
KR Patent Application No. 10-2021-7006048—Korean Office Action and Search Report, dated Dec. 15, 2021, with English Translation, 10 pages.
EP Patent Application No. 19843248.6—European Search Report, dated Mar. 18, 2022, 8 pages.
EP Patent Application No. 19871839.7—European Search Report, dated Jun. 1, 2022, 10 pages.
KR Patent Application No. 10-2021-7013688—Korean Office Action and Search Report, dated May 10, 2022, with English Translation, 13 pages.

* cited by examiner

ERROR CORRECTION IN ROW HAMMER MITIGATION AND TARGET ROW REFRESH

CROSS-REFERENCE TO RELATED APPLICATIONS

This application is a continuation of U.S. application Ser. No. 17/080,238, filed Oct. 26, 2020; which is a continuation of U.S. application Ser. No. 16/237,147, filed Dec. 31, 2018, now U.S. Pat. No. 10,817,371; each of which is incorporated herein by reference in its entirety.

TECHNICAL FIELD

The present disclosure generally relates to a memory system, and more specifically, relates to incorporating error correction into row hammer mitigation and target row refresh operations.

BACKGROUND

Memory devices are widely used to store information related to various electronic devices such as computers, wireless communication devices, cameras, digital displays, and the like. Memory devices may be volatile or non-volatile and can be of various types, such as magnetic hard disks, random access memory (RAM), read only memory (ROM), dynamic RAM (DRAM), synchronous dynamic RAM (SDRAM), and others. Information is stored in various types of RAM by charging a memory cell to have different states. Improving RAM memory devices, generally, can include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
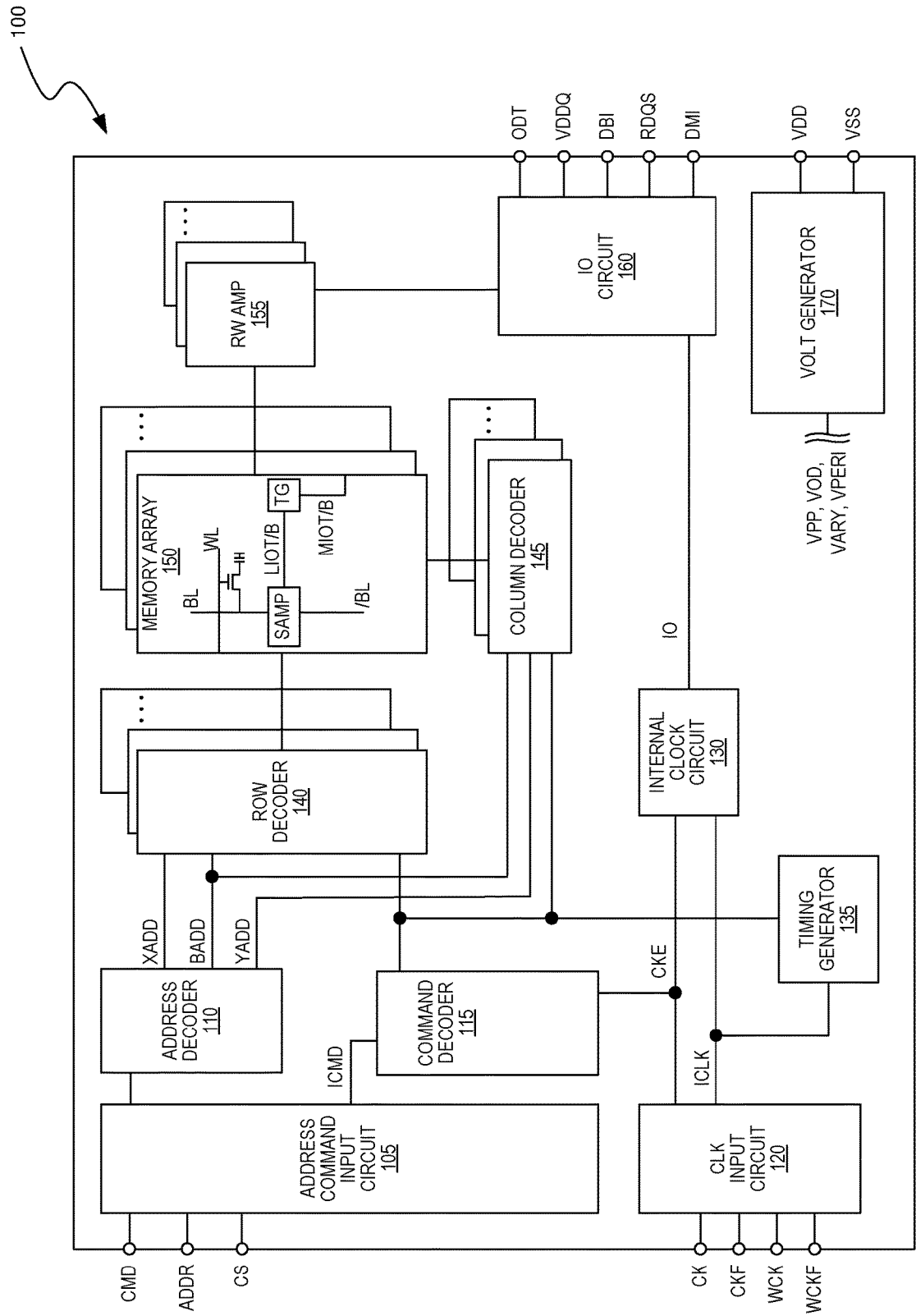
FIG. 1 illustrates a simplified block diagram schematically illustrating a memory device in accordance with an embodiment of the present technology.

Methods, systems, and apparatuses for memory (e.g., DRAM) are disclosed that have an error check and scrub (ECS) procedure in conjunction with refresh operations. The described ECS procedure may be used to mitigate issues that result from row hammer phenomena or other malicious accesses or suboptimal operations.

By way of example, some semiconductor memory devices, such as DRAM, store information as charge accumulated in cell capacitors ("cells"), with the cells organized into rows. In some cases, charge applied to cells in one row can interfere with charge in one or more adjacent "victim" rows or cells can otherwise lose their charge, an occurrence referred to as "leakage." Certain instances of leakage can occur when memory rows experience "row hammering," which is when a row is repeatedly driven to an active level in a short time (e.g., over a duration less than that between sequential refresh operations) and the activations affect one or more adjacent victim rows. This can result in changes to cell charges in the victim rows, putting the information stored there at risk.

Various memory systems use one or more strategies to address leakage, such as row hammer mitigation or target row refreshing (TRR). Row hammer mitigation can include a host or controller automatically performing refresh operations on victim rows on a random or periodic basis. In some implementations, the periodic basis can be adjusted based on memory characteristics, such as temperature (e.g., with warmer temperatures generally warranting more frequent refresh operations). Target row refreshing can identify target rows, such as victim rows, to refresh based on adjacent row activity that may cause leakage. For example, the system can keep refresh counters to refresh adjacent rows when the counter reaches a threshold within a time window. Thus, TRR identifies possible victim rows, by counting a number of row activations and comparing it a maximum threshold or a maximum window threshold. In some implementations, the maximum threshold or maximum window threshold can be set specific to each memory unit.

A refresh operation, triggered by row hammer mitigation, TRR, or other circumstance, can correct for leakage in a target row, preventing the information from being lost. A refresh operation senses or "reads" the information stored in a memory row and writes the information back to the same row. More specifically, a refresh operation senses the charge of cell in the row, interprets each charge as a one or a zero, and writes back to each cell a charge corresponding to the interpreted value. Thus, refresh operations can help prevent bit errors by renewing cell charges before they degrade to a point where the charge level no longer corresponds to the original stored bit value.

However, refresh operations do not correct errors that can occur if a cell's charge has changed enough that the charge is interpreted as the wrong value (i.e. the cell's bit has "flipped"). Error correction codes (ECC) can correct single bit flip errors when they are discovered. However, checking for and correcting such errors (i.e. error check and scrub—"ECS"), is typically delayed until the memory is accessed, e.g. during a read operation. This delay can increase the likelihood of more than one bit in a code word being flipped, an error condition which may exceed the correction capacity of the ECC. In addition, when there is an error, the correction process can delay the read or write operation, causing latency in the memory device.

Aspects of the present disclosure address the above and other deficiencies by incorporating an error check and scrub (ECS) procedure into refresh operations. Performing ECS operations during a refresh operation provides greater opportunity for discovering single bit flip errors before they are compounded by additional bit flips. In addition, correcting bit errors during a refresh can reduce the likelihood of having to perform error correction during a read or write operation, when the increased latency caused by the correction could negatively impact the performance of the memory device.

In various implementations, ECS can be performed by a specifically designated circuit, e.g. an ECS circuit on a DRAM die, or can be performed by other firmware or software, e.g. through instructions executed by a controller either on the memory device or external to the memory device, such as a CPU. When a refresh operation is initiated, causing the code words in a memory row to be read into a buffer, the disclosed technology initiates ECS procedures on the sensed code words. The ECS can continue checking and correcting code words during the sensing portion of the refresh operation. When the write portion of the refresh begins, any code words discovered to have errors have been corrected before the data is written back to the memory row.

However, in existing systems, there is not always sufficient time to perform ECS on an entire memory row during a refresh operation. Aspects of the present disclosure address this further problem by making the ECS procedure, incorporated into the refresh operations, incremental. Incremental ECS for a row can check the code words stored in a row across multiple refresh operations, beginning each ECS at the code word where the pervious ECS for that row left off. This can be accomplished by storing a counter for each row for which incremental ECS is in progress, indicating where ECS should being during the next refresh.

While incremental ECS allows distributed code word corrections in a memory row across multiple refresh operations, not all memory cells perform equally. Thus, performance can be improved by performing ECS on codewords with poorly performing cells more often than codewords with higher performing cells. When a codeword has an error once, or more than a threshold number of times, it can signal that the codeword includes one or more poorly performing cells, and thus should be checked more frequently. The disclosed technology can keep track of code words to be checked out of order (OOO), e.g. using a bit mask for the memory row. During certain refresh operations, e.g. every fourth refresh for a row, ECS can be performed on the next code word marked for OOO checking instead of the next code word indicated by the counter for standard incremental ECS for that row.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ, and on-die termination terminal(s) ODT.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The on-die termination terminal(s) may be supplied with an on-die termination signal ODT. The on-die termination signal ODT can be supplied to the input/output circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

Memory devices such as the memory device 100 of FIG. 1 can be configured to perform refresh operations on portions of the memory array 150 in response to commands received from a connected host device or memory controller. The memory device 100 can track the addresses of the memory array 150 at which refresh operations are performed (e.g., in an address pointer), and can further track the number of refresh operations performed at the most recent address (e.g. in a bank counter).

As set forth above, leakage effects can degrade the information stored in the memory array 150. Row hammer mitigation or target row refresh operations can trigger refresh operations to help prevent information degradation. However, such refresh operations alone cannot correct degradation that has already caused a bit to flip in the memory array. Accordingly, in various embodiments of the present disclosure, while refresh operations are being carried out, ECS operations are conducted on at least a portion of the code words in the row being refreshed. Which code words in a row receive the ECS operations can be controlled by one or more row-specific counters tracking where the ECS left off in previous refresh operation. In some implementations, the selection of code words to correct can be further based on whether the ECS for this refresh operation has been designated for out-of-order code word corrections.

Figure 2:
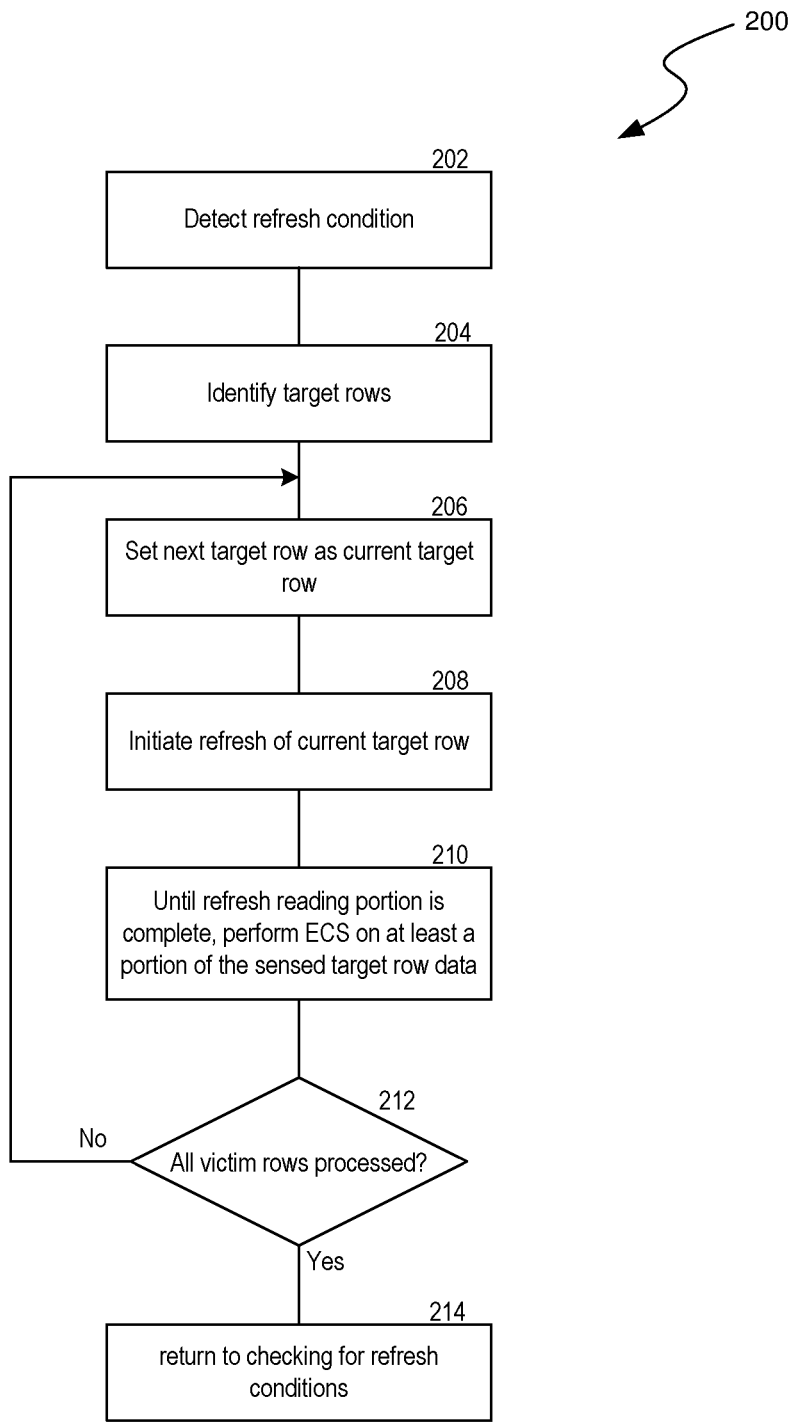
FIG. 2 is a flow diagram of integrating a partial error check and scrub (ECS) into a refresh operation, in accordance with some embodiments of the present disclosure.

FIG. 2 is a flow diagram of an example method 200 for integrating a partial error check and scrub (ECS) into a refresh operation, in accordance with some implementations of the present technology. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 202, method 200 can detect a refresh condition for correcting possible charge errors. In various implementations, detecting the refresh condition can be performing a row hammer mitigation or a target row refresh (TRR). Row hammer mitigation can select rows to refresh on a periodic or random basis. The rows to refresh can be selected sequentially. TRR can keep one or both of a count of total row accesses or accesses within a time window. When one of the counts exceeds a corresponding threshold, it can signal the refresh condition.

At block 204, method 200 can identify one or more target rows for which a refresh is to be performed. When the refresh condition is a TRR count exceeding a threshold for a particular row, the target rows can be one or more victim rows on one or both sides of the particular row. When the refresh condition is row hammer mitigation the target rows can be sequentially selected or can be one or more victim rows adjacent to a particular row.

At block 206, method 200 can set the next target row, of the rows selected at block 204, as the current target row. If this is the first time block 206 has been reached in this invocation of method 200, the first row from the one or more rows selected at block 204 can be set as the current target row.

At block 208, method 200 can begin a refresh operation on the current target row. Beginning the refresh operation can include reading code words from the current target row to be written back to the current target row.

At block 210, method 200 can perform error check and scrub (ECS) operations on code words that were sensed as part of the refresh operation that was begun at block 208. Method 200 can perform ECS on as many code words as possible until the refresh operation is ready to write the data back to the target row. In various implementations, this can be a set amount or variable amount of code words, depending on whether the technology is implemented to use a constant amount of clock cycles to perform a refresh and a constant amount of clock cycles to perform ECS on a code word. In either case, method 200 can use a counter to specify which code word in the row last received ECS. Each time method 200 reaches block 200 for the same target row, it can use the counter to determine from which code word to start ECS, thus providing incremental ECS across refresh operations. In some implementations, code words that have been corrected in the past can be tagged for future out-of-order (OOO) ECS. For example, method 200 can select one of the OOO tagged codeword every fifth time ECS is run for a particular target row, which can be tracked with a second counter. Additional details on performing incremental ECS during refresh operations are provided below in relation to FIG. 3.

At block 212, method 200 can determine whether all the target rows selected at block 204 have been refreshed through blocks 206-210. If so, method 200 can, at block 214, return to checking for refresh conditions which can cause a next invocation of method 200. If not, method 200 can continue back to block 206 to set the next target row as the current target row.

Figure 3:
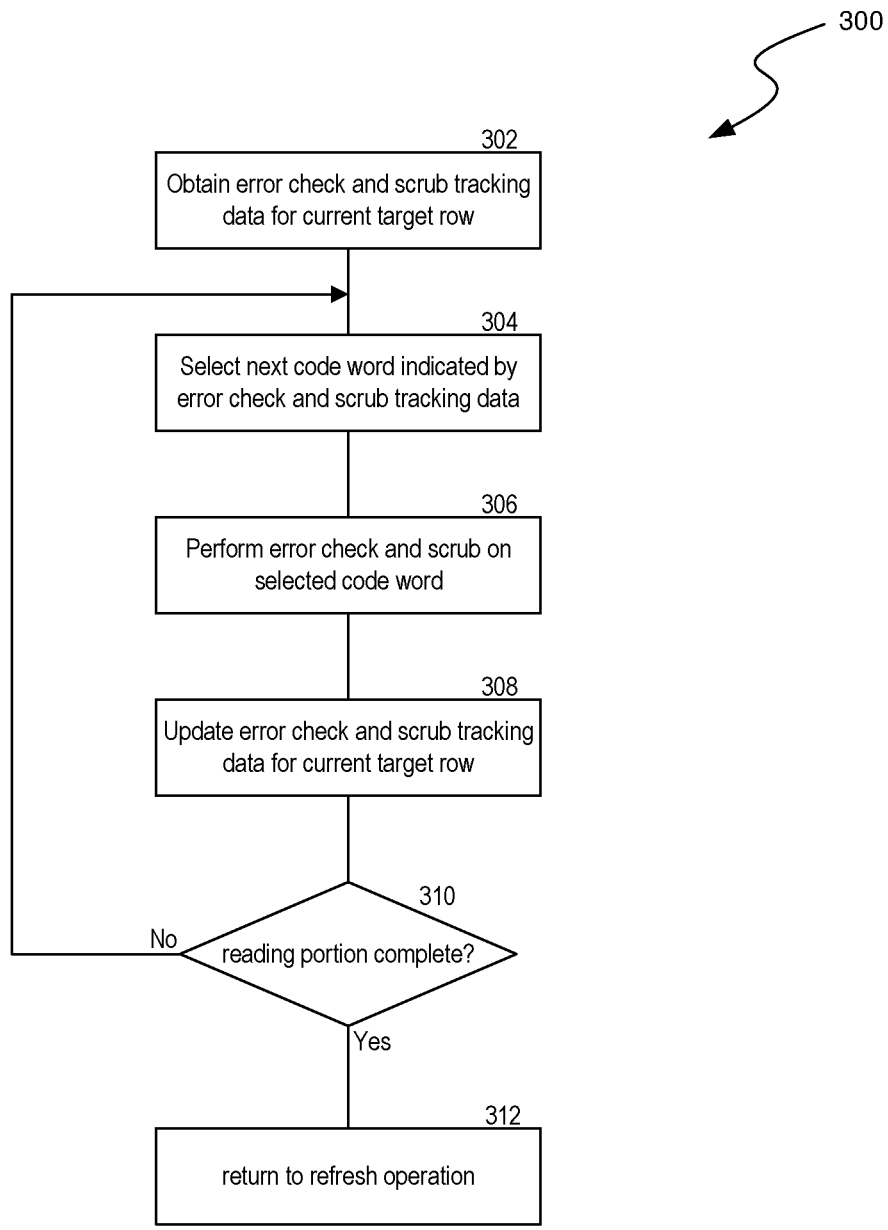
FIG. 3 is a flow diagram of performing incremental ECS during refresh operations, in accordance with some embodiments of the present disclosure.

FIG. 3 is a flow diagram of a method 300 for performing incremental ECS during refresh operations, in accordance with some implementations of the present technology. In some implementations, method 300 can be performed as a sub-process of block 210. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 302, method 300 can obtain ECS tracking data for a current target row. ECS tracking data can include an indicator of which code word was last checked for errors in a previous iteration of method 300 for the current target row. If no such indicator has been set, method 300 can set an indicator for the first code word of the current target row.

In some cases, cells in a code word can be more prone to leakage errors than other cells. For example, a cell may be more susceptible to hammering or have a lower charge retention time. When a code word includes such low performing cells, they are more likely to have errors. Thus, it can be beneficial to perform ECS on such code words more often than code words without low performing cells. Performing ECS on such code words more often is referred to herein as performing ECS out-of-order (OOO). In implementations that performs OOO ECS, the obtained ECS tracking data can include a list (e.g. a list of identifiers, a bit mask for the code words in the row, etc.) of code words in the current target row that have been identified for OOO ECS.

At block 304, method 300 can select a next code word for ECS, as indicated by the ECS tracking data from block 302. In implementations that do not implement OOO ECS or that are not using the OOO list in this instance of reaching block 304, the next code word can be the code word indicated by the ECS tracking data indicator. In implementations that implement OOO ECS, method 300 can first determine whether this iteration of method 300 will perform in-order ECS in which all row code words are eligible for ECS, or OOO ECS in which only code words on the OOO list in the ECS tracking data are eligible for ECS. In various implementations, this determination of whether to select from the OOO list can be made for the entire invocation of method 300 or for each iteration of the loop between block 304-310. In some embodiments, this determination can be a periodic selection, for example choosing to select from the OOO list in every third instance. When the result of the determination is to select from the OOO list, the next code word can be the code word indicated by an indicator specific to the OOO ECS list.

At block 306, method 300 can perform ECS for the code word selected at block 304. ECS can be performed by a specifically designated chip, e.g. an ECS chip on a DRAM die, or can be performed by other firmware or software, e.g. through instructions executed by a controller either on the memory device or external to the memory device, such as a CPU. ECS can use an error-correcting code, such as single-error correction (SEC) or single-error correction and double-error detection (SECDED), to identify and correct errors in the selected code word. Corrected code words can be included in data stored from the refresh reading portion so the corrected version is written back instead of the originally sensed data.

At block 308, method 300 can update the ECS tracking data for the current target row. In implementations that do not implement OOO ECS or are not using the OOO list in this instance of reaching block 308, the updating can include incrementing the ECS tracking data indicator to indicate a next code word in the current target row.

In implementations that implement OOO ECS, and if the code word needed to be corrected at block 306, the updating can include adding the code word to the OOO list (e.g. setting the bit in the bit mask for that code word to 1). In some implementations, the code word can be added to the OOO list only if it has been corrected, at various instances of reaching 306, a threshold number of times. Also in implementations that implement OOO ECS and where method 300 used the OOO list for the ECS operation at block 306, method 300 can increment the ECS tracking data indicator specific to the OOO list to indicate a next code word on the OOO list.

The process in blocks 304-308 of performing ECS on sensed code words can iterate, as indicated at block 310, until a reading portion of the refresh operation is complete. This can be a set amount of time based on a configuration of the memory device, e.g., a number of clock cycles necessary to perform the reading portion of the refresh operation. Once the reading portion of the refresh operation method 300 can, at block 312, return to complete the remainder of the refresh operation.

Figure 4:
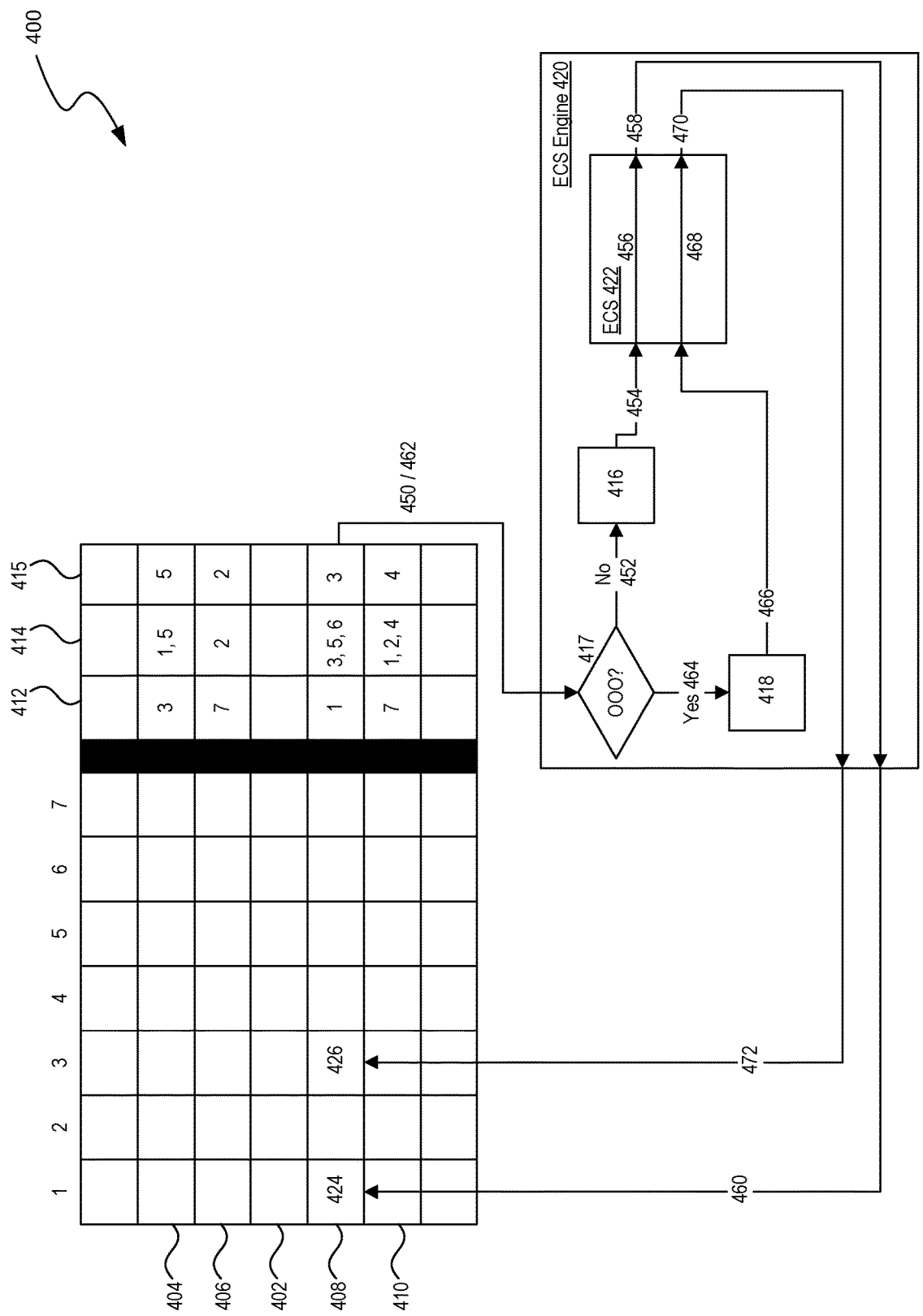
FIG. 4 is a conceptual diagram of an ECS engine that operates in conjunction with refresh operations, in accordance with some embodiments of the present disclosure.

FIG. 4 is an example conceptual diagram 400 of an ECS engine that operates in conjunction with refresh operations, in accordance with some embodiments of the present disclosure. FIG. 4 illustrates example DRAM with rows 404-410, columns 1-7 (each column corresponding to a code word in the memory row, such as code words 424 and 426), and associated ECS tracking data in columns 412, 414, and 415. The ECS tracking data is shown as physically located on the same row as the corresponding code words only to illustrate the association between a row and that ECS tracking data. In fact, the ECS tracking data can be stored in the memory array of the memory chip, elsewhere on the memory chip, or in other storage external to the memory. In addition, while the values shown in columns 412 and 414 are represented as integers, other representations can be used. For example, instead of a list of integers in row 414, the OOO list can be represented as a bit mask with one bit corresponding to each code word column in the memory, where a bit set to 1 indicates the corresponding code word is on the OOO list.

FIG. 4 also illustrates an ECS Engine 420 that receives some of the code words sensed during a refresh operation and performs ECS on them. ECS Engine 420 includes logic 417 to determine whether to perform ECS in-order or out-of-order, code word choosers 416 and 418, and an ECS component 422 to perform ECS on a chosen code word. ECS component 422 can be an ECS chip on the DRAM die or can be a module implemented through firmware or software, e.g. through instructions executed by a controller either on the memory device or external to the memory device, such as a CPU.

The example in FIG. 4 begins when row 402 has been identified by a TRR process due to above a threshold number of accesses within a time window. The system in FIG. 4 is configured to identify, as target rows, the two adjacent victim rows on either side of the TRR row 402. In this case, the victim rows are rows 404-410. Example 400 illustrates the process for performing ECS on victim row 408 during a refresh operation.

At step 450, information sensed as an initial step in the refresh operation is provided to the ECS engine 420. At step 452, OOO logic 417 of the ECS engine determines that, in this iteration, row 408 should not select an OOO code word because in this example OOO ECS is performed in every fourth instance of ECS and this is a third instance of performing ECS in relation to row 408 (two instances having occurred for a previous refresh operation, which is tracked in not shown ECS tracking data).

At step 454, code word chooser 416 selects the next in-order code word, as indicated by the ECS tracking data.

In this case, the in-order counter 412 for row 408 indicates the next code word is code word 424 in column 1. Thus, code word 424 is passed to ECS component 422. Also, the ECS tracking data for row 408 can be updated by incrementing the in-order counter 412 for row 408 to indicate column 2.

At step 456, ECS component 422 performs ECS on code word 424, to determine whether there are any errors, and if so to correct them. In example 400, the threshold for adding a code word to the OOO list is one. Thus, if any errors are found, ECS engine 420 makes code word 424 a candidate for OOO ECS by updating the OOO list 414 for row 408 to include an indication of column 1, corresponding to code word 424.

At step 458, the ECS engine 420 can return the corrected code word 424. At 460, the corrected code word can be incorporated into the refresh data prior to the refresh data being written back to row 408.

At step 462, the refresh operation is still sensing code words from row 408 and the ECS engine has time to perform ECS on another code word. Thus, at step 464, OOO logic 417 of the ECS engine determines that, in this iteration, row 408 should select an OOO code word because this is a fourth instance of performing ECS in relation to row 408.

At step 466, code word chooser 418 selects the next OOO code word, as indicated by the ECS tracking data. In this case, the OOO counter 415 for row 408 indicates the next code word is code word 426 in column 3. Thus, code word 426 is passed to ECS component 422. Also, the ECS tracking data for row 408 can be updated by setting the counter 415 for row 408 to indicate the next code word on the OOO list 414 for row 408, which in this case is for column 5.

At step 468, ECS component 422 performs ECS on code word 426, to determine whether there are any errors, and if so corrects them. At step 470, the ECS engine 420 can return the corrected code word 426. At 472, the corrected code word can be incorporated into the refresh data prior to the refresh data being written back to row 408.

When the refresh operation is ready to write the data back to row 408, any corrections made to code words 424, 426, and corrections for any other code words for which the ECS engine 420 had time to perform ECS are incorporated in the written back data. Example 400 would perform similar refresh with ECS operations on the other victim rows 404, 406, and 410.

Figure 5:
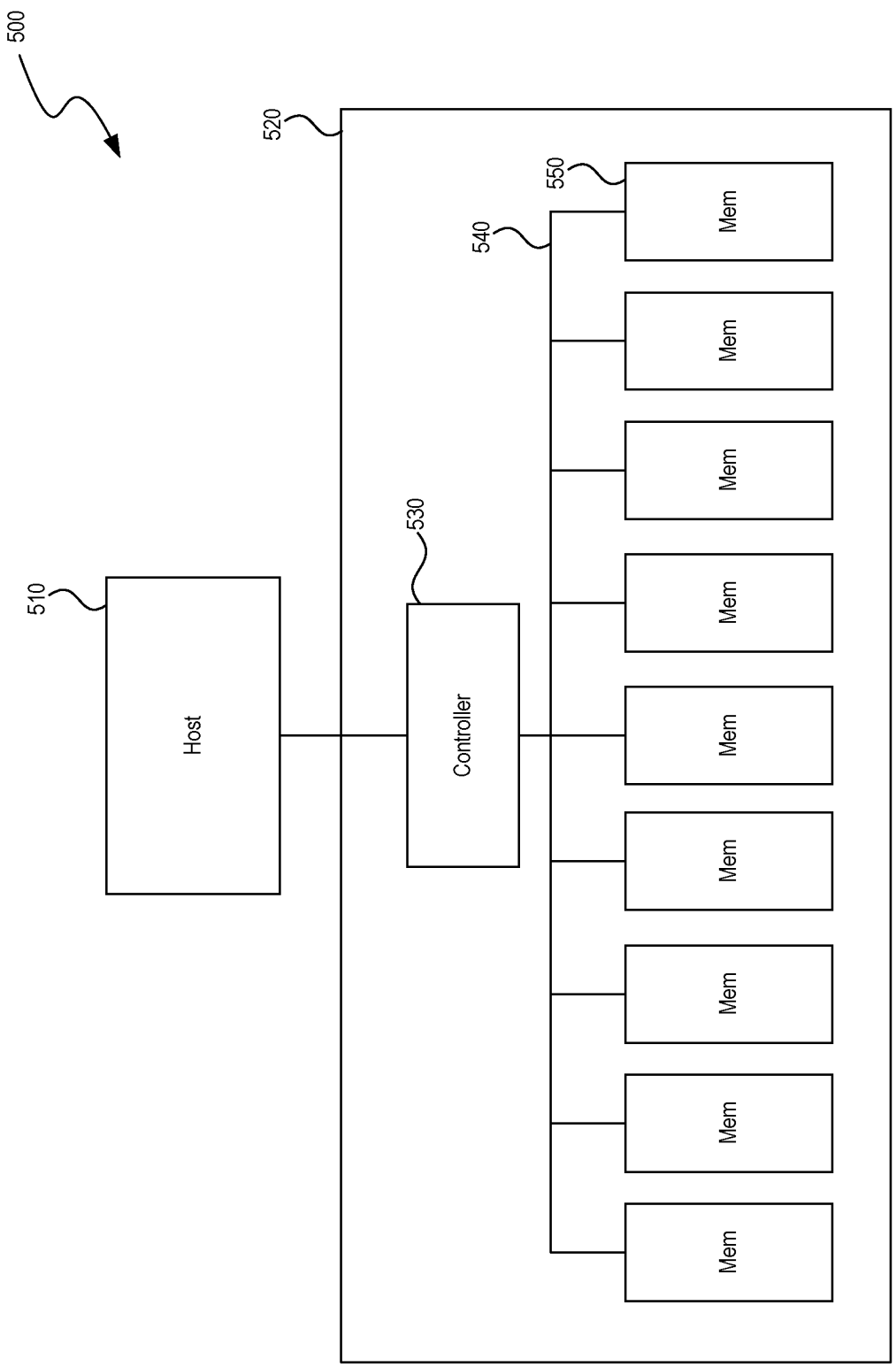
FIG. 5 is a simplified block diagram schematically illustrating an example memory system, in accordance with some embodiments of the present disclosure.

FIG. 5 is a simplified block diagram schematically illustrating a memory system 500 in accordance with an embodiment of the present technology. Memory system 500 includes a host device 510 operably coupled to a memory module 520 (e.g., a dual in-line memory module (DIMM)). Memory module 520 can include controller circuitry 530 operably connected by a bus 540 to a plurality of memory devices 550. In accordance with one aspect of the present disclosure, the host device 510 can maintain a bank counter to track refresh operations (e.g., the subset of refresh operations not directed to row hammer mitigation). In accordance with another aspect of the present disclosure, the host device 510 can perform refresh operations on the memory devices 550, either in accordance with a refresh schedule, in response to detected activity at the memory devices, or both. In accordance with yet another aspect of the present disclosure, during the execution of a refresh operation, host device 510, control circuitry 530, or other ECS circuitry or chip (not shown) can perform ECS on one or more code words, selected according to ECS tracking data, sensed during the refresh.

Figure 6:
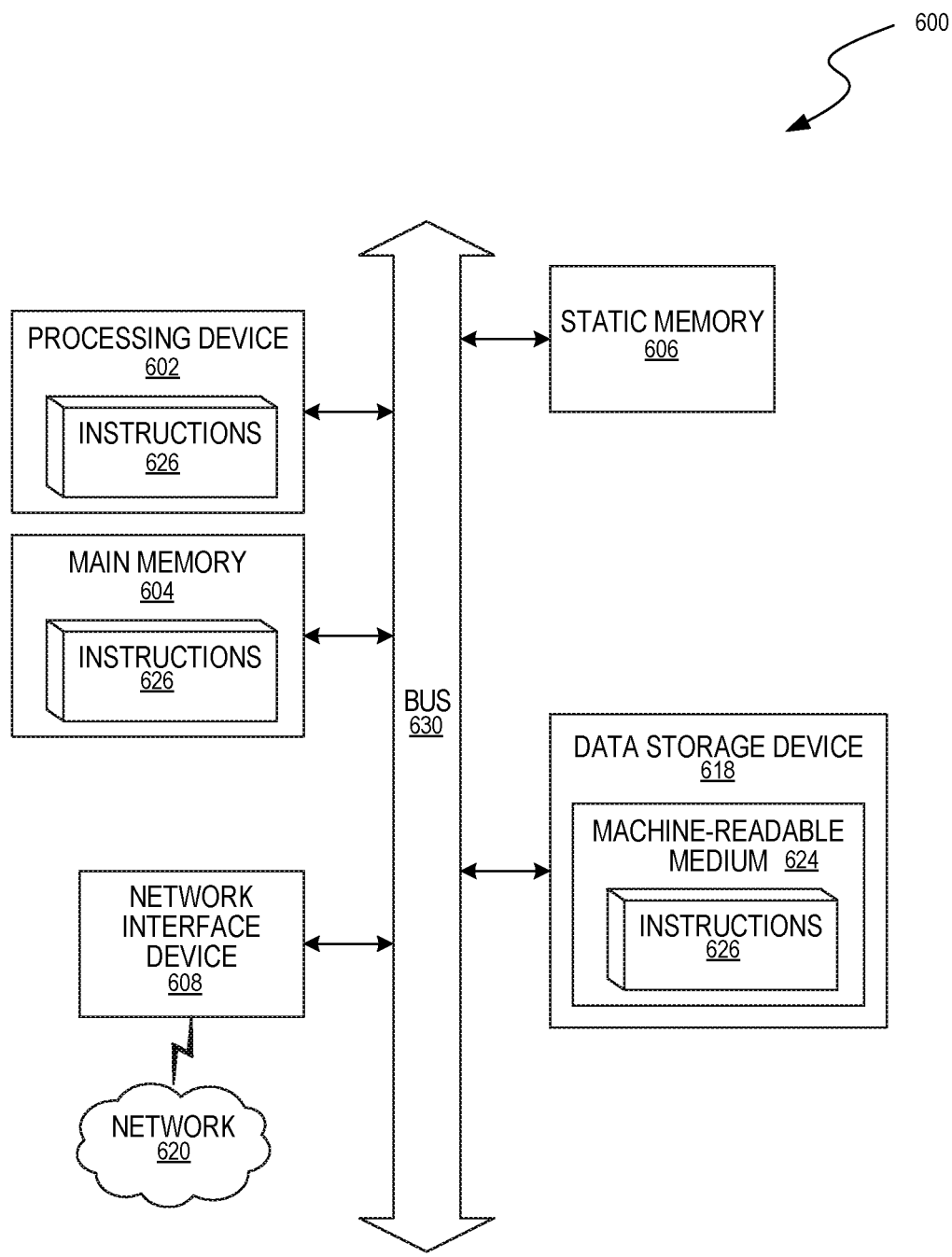
FIG. 6 is a block diagram of an example computer system in accordance with some embodiments of the present disclosure.

FIG. 6 illustrates an example machine of a computer system 600 within which a set of instructions, for causing the machine to perform any one or more of the methodologies discussed herein, can be executed. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media.

While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

Those skilled in the art will appreciate that the components and blocks illustrated in FIGS. 1-6 described above, may be altered in a variety of ways. For example, the order of the logic may be rearranged, substeps may be performed in parallel, illustrated logic may be omitted, other logic may be included, etc. In some implementations, one or more of the components described above can execute one or more of the processes described below.

Reference in this specification to "implementations" (e.g. "some implementations," "various implementations," "one implementation," "an implementation," etc.) means that a particular feature, structure, or characteristic described in connection with the implementation is included in at least one implementation of the disclosure. The appearances of these phrases in various places in the specification are not necessarily all referring to the same implementation, nor are separate or alternative implementations mutually exclusive of other implementations. Moreover, various features are described which may be exhibited by some implementations and not by others. Similarly, various requirements are described which may be requirements for some implementations but not for other implementations.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range. Relative terms, such as high or unimportant, when not otherwise defined, can be understood as assigning a value and determining how that value compares to an established threshold. For example, the phrase "selecting a fast connection" can be understood to mean selecting a connection that has a value assigned corresponding to its connection speed that is above a threshold.

As used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

Any patents, patent applications, and other references noted above are incorporated herein by reference. Aspects can be modified, if necessary, to employ the systems, functions, and concepts of the various references described above to provide yet further implementations. If statements or subject matter in a document incorporated by reference conflicts with statements or subject matter of this application, then this application shall control.

We claim:

1. A method comprising:
  initiating a refresh operation on a target row in which are stored a plurality of code words, wherein the refresh operation includes reading the plurality of code words into a buffer;
  performing an error checking operation on a subset of the plurality of code words;
  correcting an error in one code word of the subset by overwriting the one code word in the buffer with a corrected code word; and
  completing the refresh operation by writing back the plurality of code words, including the corrected code word, from the buffer to the target row.

2. The method of claim 1, wherein the subset includes a single code word of the plurality of code words.

3. The method of claim 1, wherein the subset includes more than one, but less than all, of the plurality of code words.

4. The method of claim 1, further comprising identifying a row hammer condition in the target memory row, and wherein initiating the memory refresh operation is performed in response to identifying the row hammer condition.

5. The method of claim 4, wherein the row hammer condition in the target memory row is associated with a particular row identified as having potential leakage and wherein the target memory row is a row adjacent to the particular row.

6. The method of claim 1, further comprising updating tracking data stored in relation to the target row indicating the error correction operation has been performed on the subset.

7. The method of claim 1, wherein the target memory row comprises a row of an array within a dynamic random-access memory (DRAM) device.

8. A system comprising:
  a memory array;
  circuitry configured to:
    initiate a refresh operation on a target row in which are stored a plurality of code words, wherein the refresh operation includes reading the plurality of code words into a buffer;
    perform an error checking operation on a subset of the plurality of code words;
    correct an error in one code word of the subset by overwriting the one code word in the buffer with a corrected code word; and
    complete the refresh operation by writing back the plurality of code words, including the corrected code word, from the buffer to the target row.

9. The system of claim 8, wherein the subset includes a single code word of the plurality of code words.

10. The system of claim 8, wherein the subset includes more than one, but less than all, of the plurality of code words.

11. The system of claim 8, wherein the circuitry is further configured to identify a row hammer condition in the target memory row, and to initiate the memory refresh operation in response to identifying the row hammer condition.

12. The system of claim 11, wherein the row hammer condition in the target memory row is associated with a particular row identified as having potential leakage and wherein the target memory row is a row adjacent to the particular row.

13. The system of claim 8, wherein the circuitry is further configured to update tracking data stored in relation to the target row indicating the error correction operation has been performed on the subset.

14. The system of claim 8, wherein the target memory row comprises a row of an array within a dynamic random-access memory (DRAM) device.

15. A non-transitory computer-readable storage medium comprising instructions that, when executed by one or more processing devices, cause the one or more processing devices to:
    initiate a refresh operation on a target row in which are stored a plurality of code words, wherein the refresh operation includes reading the plurality of code words into a buffer;
    perform an error checking operation on a subset of the plurality of code words;
    correct an error in one code word of the subset by overwriting the one code word in the buffer with a corrected code word; and
    complete the refresh operation by writing back the plurality of code words, including the corrected code word, from the buffer to the target row.

16. The non-transitory computer-readable storage medium of claim 15, wherein the subset includes a single code word of the plurality of code words.

17. The non-transitory computer-readable storage medium of claim 16, wherein the subset includes more than one, but less than all, of the plurality of code words.

18. The non-transitory computer-readable storage medium of claim 17, wherein the instructions, when executed by the one or more processing devices, further cause the one or more processing devices to identify a row hammer condition in the target memory row, and to initiate the memory refresh operation in response to identifying the row hammer condition.

19. The non-transitory computer-readable storage medium of claim 18, wherein the row hammer condition in the target memory row is associated with a particular row identified as having potential leakage and wherein the target memory row is a row adjacent to the particular row.

20. The non-transitory computer-readable storage medium of claim 15, wherein the instructions, when executed by the one or more processing devices, further cause the one or more processing devices to update tracking data stored in relation to the target row indicating the error correction operation has been performed on the subset.

* * * * *